United States Patent [19]

Iwasaki

[11] Patent Number: 4,518,865
[45] Date of Patent: May 21, 1985

[54] MISOPERATION PREVENTION CIRCUIT

[75] Inventor: Tomonobu Iwasaki, Yokohama, Japan

[73] Assignee: Fujitsu Limited, Kanagawa, Japan

[21] Appl. No.: 387,559

[22] Filed: Jun. 11, 1982

[30] Foreign Application Priority Data

Jun. 18, 1981 [JP] Japan .................. 56-94282

[51] Int. Cl.³ .............. H03K 17/06; G06F 1/00; G06F 11/00
[52] U.S. Cl. .............. 307/200 A; 307/200 B; 377/28
[58] Field of Search ........ 307/200 A, 200 B; 377/28

[56] References Cited

U.S. PATENT DOCUMENTS 4,232,236 11/1980 Yomogida et al. ............ 307/200 A

FOREIGN PATENT DOCUMENTS 0023124 1/1981 European Pat. Off. .
0025195 9/1981 European Pat. Off. .

OTHER PUBLICATIONS

Electronic Engineering, "Power-On Reset/Run Circuits For The CFP1802muP", vol. 51, No. 627, Sep. 1979, pp. 25 and 29.

Primary Examiner—John S. Heyman
Attorney, Agent, or Firm—Armstrong, Nikaido Marmelstein & Kubovcik

[57] ABSTRACT

A misoperation prevention circuit for preventing the misoperation of the integrated circuit having standby made. The misoperation prevention circuit comprises an integrator for receiving a control signal for controlling the operational mode of the oscillator and first and second gates in the LSI circuit for receiving the output of the integrator, with the output of the first gate being coupled to the oscillator and the output of the second gate being coupled to the internal logic circuit. A first threshold voltage of the first gate is lower than a second threshold voltage of the second gate. The oscillation is triggered when output voltage of the integrator exceeds the first threshold voltage but the internal logic circuits are maintained in a standby mode by the second gate until the output voltage of the integrator exceeds the second threshold voltage. The time between the occurrence of the first threshold voltage and the second threshold voltage is greater than or equal to the time required for the oscillator to reach stable oscillation.

4 Claims, 5 Drawing Figures

4,518,865

MISOPERATION PREVENTION CIRCUIT

BACKGROUND OF THE INVENTION

1. Field of the Invention

This application is directed to a circuit for preventing misoperation of an integrated circuit during the time period when an oscillator, which generates clock pulses used in the circuit reaches a stabilized state and more particularly, to an integrated circuit which includes an oscillator and a pair of gate circuits in the integrated circuit wherein one gate circuit triggers the oscillator to initiate operation thereof and the second gate circuit triggers an internal circuit in the integrated circuit after a period of time during which the oscillator is stabilized.

2. Description of the Prior Art

Low power consumption is always required in the C. MOS IC such as microprocessor LSI and therefore supply of clock to the internal logics is suspended using external standby control signal during non-operating condition by providing the standby mode. Simultaneously, it is also required to stop the operation of the oscillation circuit itself which generates the basic clock. However, use of a crystal resonator or ceramic resonator as the oscillation element requires at least several tens of milli-second (ms) until the oscillation output is stabilized after triggering the oscillation circuit. Therefore, when operation of the oscillator is initiated by means of an external control signal, there is an initial period during which the oscillator output is unstable. After this initial period, the oscillator output is stable in frequency and amplitude. The instability of the oscillator circuit output can result in misoperation of the processing unit and/or other internal circuits of the microprocessor IC. Thus, in order to prevent misoperation of the type described, it is necessary upon receipt of a control signal from an external source to initiate operation of the oscillator but to simultaneously prevent the application of the oscillator output to the internal logic circuits during the period of stabilization and after stabilization to apply the oscillator output, which is the clock signal, to the internal logic circuits.

One type of prior art misoperation prevention circuit for use with a C-MOS IC has a standby mode in which the internal logic circuits do not operate until after a predetermined period of time has elapsed from the initiation of oscillation. Prior art circuits of this type are shown in FIGS. 1 and 2.

Referring to FIG. 1, integrated circuit 1 includes an oscillator 3 which generates a clock signal which is applied to internal logic circuits which are part of the integrated circuit 1. The oscillation circuit 3 is triggered by a transistor 5 which as a control signal applied thereto, when a logic level of the control signal becomes high. The output of delay circuit 7 is applied to integrated circuit 1 to return the circuit to a operational mode after a predetermined period of time after the control signal is applied to the oscillator 3 via the transistor 5. The circuit of FIG. 1 has the disadvantage that it requires an external control circuit including the transistor 5, the delay circuit 7, and two control input terminals.

FIG. 2 illustrates another prior art type circuit, similar to FIG. 1, which eliminates the external circuits of FIG. 1 by incorporating the timer circuit 7' into the integrated circuit 1. The operation of the circuit in FIG. 2 is similar to that of FIG. 1. However, the circuit of FIG. 2 has the disadvantage that since the timer circuit 7' is part of the integrated circuit 1, the time period of the timer 7' cannot be adjusted. In addition, a large space is required for fabricating the timer circuit 7' in an IC chip, since several tens of transistors are necessary.

SUMMARY OF THE INVENTION

It is an object of the present invention to provide a misoperation prevention circuit for use in a C-MOS IC such as a Microprocessor LSI which eliminates the need for an external control signal input circuit.

It is a further object of the present invention to provide a misoperation prevention circuit in which the predetermined time between the triggering of an oscillator and the triggering the internal logic circuits, is adjustable.

It is still a further object of the present invention to provide a misoperation prevention circuit which utilizes a simple external RC circuit and two internal gate circuits having different threshold voltages for initiating operation of an oscillator and inhibitting the operation of the internal logic circuits until the oscillator output is stabilizing.

The present invention is directed to a misoperation prevention circuit for the integrated circuit such as a Microprocessor includes an oscillator and two gate circuits having different threshold levels. A control signal for releasing a standby mode is applied to the gate circuits through an external RC integrator circuit. When the output voltage of the integrator exceeds a first threshold voltage, an output of a first gate circuit triggers the oscillator. When the output voltage of the integrator exceeds a second threshold voltage, an output of the second gate, circuit triggers the internal logic circuits of the integrated circuit. Therefore the internal logic circuit is triggered, after a predetermined period of time, in which the oscillator becomes stabilized.

BRIEF DESCRIPTION OF THE DRAWINGS

FIG. 5 illustrates the relationship of voltage versus time at various points in the circuit of the present invention shown in FIG. 4.

DETAILED DESCRIPTION OF THE PREFERRED EMBODIMENT

Figure 1:
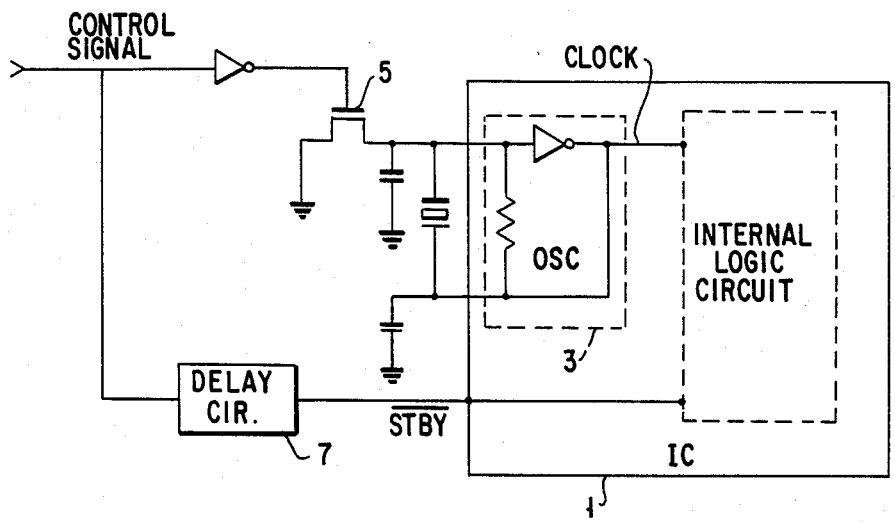
FIG. 1 is one embodiment of a prior art misoperation prevention circuit.
Figure 2:
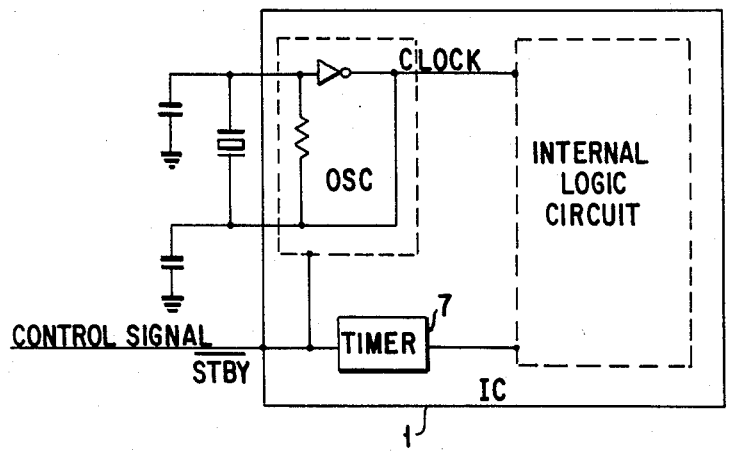
FIG. 2 is a second embodiment of a prior art misoperation prevention circuit.
Figure 3:
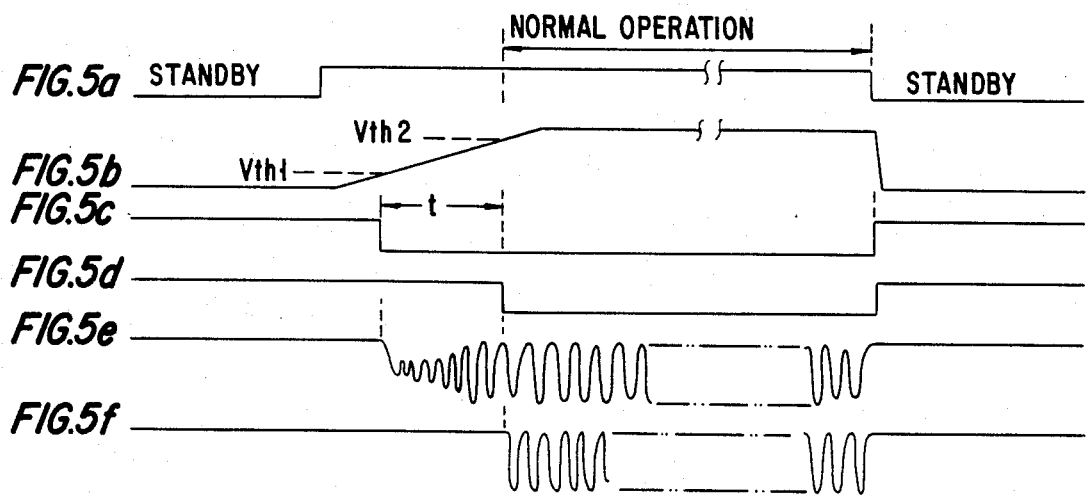
FIG. 3 is a circuit diagram of the preferred embodiment of the present invention.
Figure 3:
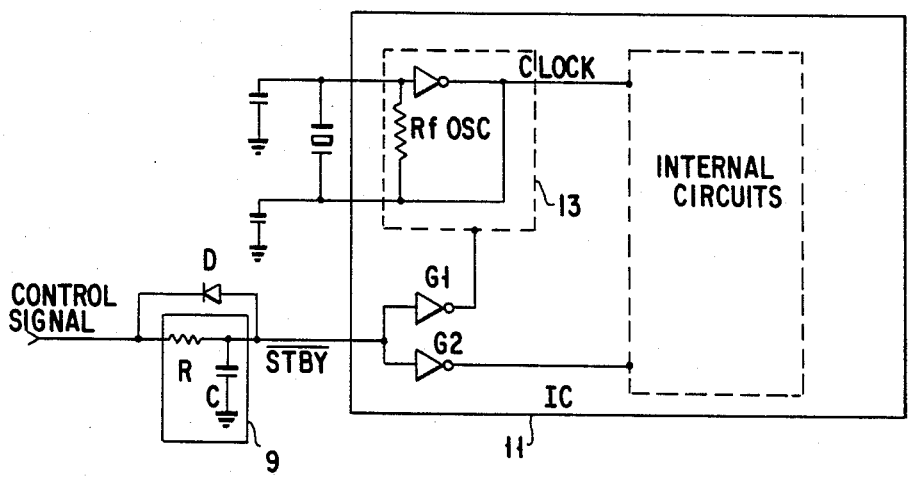

Referring to FIG. 3, a control signal is applied to an integrator 9, the output of which is applied to gate circuits G1 and G2 which are part of an integrated circuit 11. The gate circuits G1 and G2 have different threshold voltage $V_{th}$ ($V_{th1} < V_{th2}$). When the output of integrator 9 exceeds a threshold voltage $V_{th1}$ of the gate circuit G1, an output of the gate circuit G1 triggers oscillation of the oscillator 13. After a predetermined period of time during which the clock output of oscillator 13 becomes stabilized, the voltage output of integrator 9 exceeds a second threshold voltage $V_{th2}$ of the second gate circuit. As a result an output of the second gate circuit triggers the internal circuit.

Thus, it can be seen that when the output of integrator exceeds the first threshold value $V_{th1}$, the oscillation is initiated but the output of the oscillator is unstable and can cause misoperation of the internal circuits. Therefor the operation of the internal circuits is inhibitted. Rather, it is not until the output voltage of the integrator exceeds a second threshold voltage $V_{th2}$ wherein gate G2 is operated to trigger the internal circuits. The time required for the output voltage of the integrator 9 to reach the voltage $V_{th2}$ corresponds to the period required for the output of the oscillator to stabilize. This time period can be simply adjusted by adjusting the time constant of RC circuit in integrator 9.

Figure 4:
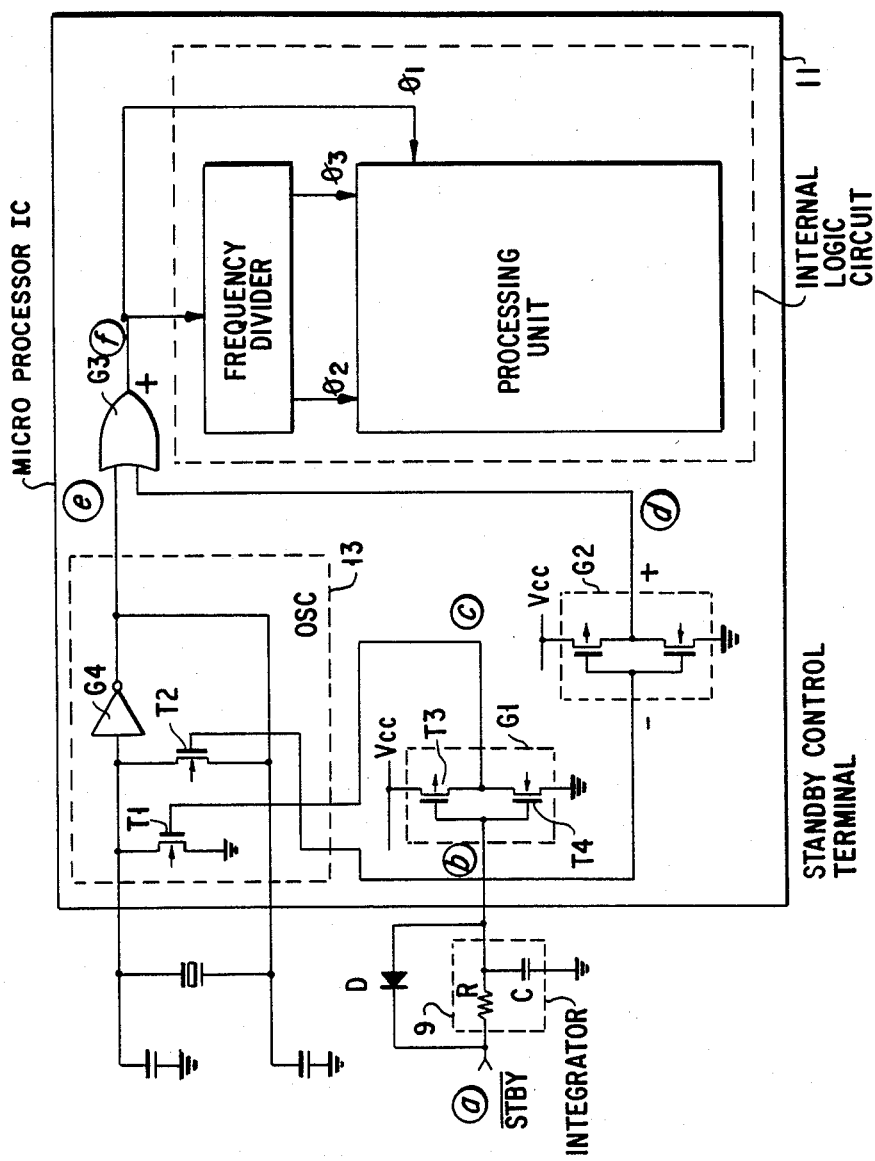
FIG. 4 is a detailed schematic circuit diagram of the preferred embodiment of the present invention.

Referring to FIG. 4, a control signal is applied to the input of integrator 9 at point a. The control signal is illustrated in FIG. 5A. The output of the integrator 9, as shown in FIG. 5B, is applied to the input b of both gate circuits G1 and G2. The output of G1 at point c, which is shown in FIG. 5C, is applied to the oscillator 13. The output of gate G2, shown at point d, is applied to one input of OR gate G3. The output of oscillator 13, which is shown in FIG. 5E, is applied to the other input of OR gate G3, the output of which at point f, which is shown in FIG. 5F, is applied to the internal logic circuits of the integrated circuit 11. The dised D is provided for immediately making low level the input of the control terminal of the integrated circuit when the control signal becomes low.

In operation, the starting and stopping of oscillator 13 is controlled by the output c of gate G1. When the output of gate G1 is high, oscillator 13 stops oscillation and when the output of gate G1 is low, oscillation is initiated. Gate G2 controls the starting and stopping of the operation of the internal logic circuits of the integrated circuit 11. When the output of gate G2 is high, the internal logic circuits do not operate, however, when the output of gate G2 is low, the internal logic circuits operate in accordance with the clock output of oscillator 13.

When transistor T2 of oscillator 13 is conductive, it functions as a feedback resistance for the oscillator, and the initiation and stopping of the oscillator is controlled by transistor T1. When the control signal at point a is high during ordinary operation, transistor T1 is off and transistor T2 is on and thus, oscillator 13 oscillates. During this time, the voltage at point c is low and the output of the oscillator at point e is applied to gate G3. When the voltage at point a becomes low, which is used to place the microprocessor in a standby mode, transistor T2 turns off and simultaneously transistor T1 turns on fixing the input of the invertor G4 in oscillator 13 to a low level. Therefore, oscillation stops and point e is at a high level.

When the control signal at point a is at a high level for reliesing the standby mode, the voltage at point b gradually rises due to the operation of integrator 9. When the voltage at point b exceeds $V_{th1}$, the level of the point c changes to a low, T1 is turned off and T2 is turned on. As a result, oscillation begins. However, because of the relationship $V_{th1} < V_{th2}$, the point d remains at a high level and, therefore, point f is at a high level. This results in the output of the oscillator not being applied to the internal logic circuit. When the voltage at point b exceeds $V_{th2}$ after a time period t, the level of the point d changes to a low and the signal at point f, corresponds to the signal at point e, which is the output of the oscillator 13. Thus, the clock signal from the oscillator 13 is supplied to the internal logic circuit and it begins operation.

As can be seen from FIGS. 5B and 5E, the time period t is the time required for the output of the oscillator to stabilize. When the output voltage exceeds $V_{th2}$, the output of the oscillator is stabilized and this output can be applied to the internal logic circuits as the clock signal therefor. Since the unstabilized oscillator output is not applied to the internal logic circuits, the misoperation thereof is prevented.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

I claim:

1. A misoperation prevention circuit for preventing misoperation of an integrated circuit comprising a logic circuit and an oscillator for providing clock signals to said logic circuit after the release of a standby mode, the misoperation prevention circuit comprising:
    an integrator for receiving a control signal, the control signal being supplied for releasing the standby mode;
    a control terminal for receiving an output of the integrator;
    a first gate circuit having a first threshold voltage connected to the control terminal for triggering the oscillator at said first threshold voltage of said integrated output;
    a second gate circuit having a second threshold voltage connected to the control terminal for triggering said logic circuit at said second threshold voltage of said integrated ouptput;
    the second threshold voltage being larger than the first threshold voltage so that said second gate circuit is triggered after said first gate circuit and a period of the time elapses during which said oscillator is stabilized.

2. A misoperation prevention circuit as set forth in claim 1, wherein said integrator comprises an RC circuit.

3. A misoperation prevention circuit as set forth in claims 1 or 2, wherein said integrator is external to said integrated circuit.

4. A misoperation prevention circuit as set forth in claim 1 further comprises an OR gate connected between said oscillator and said logic circuit for supplying an output signal of said oscillator to said logic circuit, the OR gate being controlled by an output of the second gate circuit.

* * * * *